United States Patent [19]
Kuromitsu et al.

[11] Patent Number: 5,087,509
[45] Date of Patent: Feb. 11, 1992

[54] SUBSTRATE USED FOR FABRICATION OF THICK FILM CIRCUIT

[75] Inventors: Yoshirou Kuromitsu; Hideaki Yoshida; Toshiyuki Nagase; Tadaharu Tanaka; Yoshio Kanda, all of Saitama, Japan

[73] Assignee: Mitsubishi Metal Corporation, Tokyo, Japan

[21] Appl. No.: 524,936

[22] Filed: May 18, 1990

[30] Foreign Application Priority Data

May 22, 1989 [JP] Japan ................... 1-128285
Nov. 7, 1989 [JP] Japan ................... 1-289243

[51] Int. Cl.$^5$ ............................................. B32B 3/00
[52] U.S. Cl. ............................... 428/195; 428/209; 428/210; 428/220; 428/432; 428/697; 428/698; 428/901; 156/89; 361/397
[58] Field of Search ............... 428/209, 901, 220, 432, 428/332, 213, 215, 216, 698, 195, 701, 702, 472, 210, 469, 697, 699, 704; 156/89; 361/397

[56] References Cited

U.S. PATENT DOCUMENTS

| | | | |
|---|---|---|---|
| 4,517,584 | 5/1985 | Matsushita | 357/74 |
| 4,536,435 | 8/1985 | Utsumi | 428/901 |
| 4,556,599 | 12/1985 | Sato | 428/432 |
| 4,582,745 | 4/1986 | Schnable | 428/701 |
| 4,591,537 | 5/1986 | Aldinger | 428/901 |
| 4,659,611 | 4/1987 | Iwase | 428/901 |
| 4,810,563 | 3/1989 | DeGree | 428/901 |
| 4,908,348 | 3/1990 | Hung | 428/901 |
| 4,950,588 | 8/1990 | Sarin | 428/701 |

FOREIGN PATENT DOCUMENTS

39579 11/1979 Japan .................... 428/901

Primary Examiner—Ellis P. Robinson
Assistant Examiner—Nasser Ahmad
Attorney, Agent, or Firm—Sughrue, Mion, Zinn Macpeak & Seas

[57] ABSTRACT

An insulating substrate is used for fabrication of a thick film circuit provided with a conductive pattern made from a paste containing glass frits, and comprises a foundation containing an aluminum nitride and incidental impurities, and a multi-level surface film structure provided between the foundation and the conductive pattern and having a lower surface film of an aluminum oxide provided on a surface of the foundation, an intermediate surface film provided on the lower surface film and formed of a substance having a relatively small acidity and an upper surface film provided on the intermediate surface film and formed of a substance having a relatively large acidity, in which the substance with the large acidity rapidly reacts with the frits in a firing stage for enhancing the adhesion of the conductive pattern but the substance with the relatively small acidity restricts the consumption thereof, so that the total thickness of the multi-level film structure is decrased and, accordingly, the heat radiation capability is improved.

20 Claims, 2 Drawing Sheets

SUBSTRATE USED FOR FABRICATION OF THICK FILM CIRCUIT

FIELD OF THE INVENTION

This invention relates to a substrate and, more particularly, to a substrate suitable for fabrication of a thick film circuit in a high integration density.

DESCRIPTION OF RELATED ARTS

Various insulating substrates are used for fabrication of thick film circuits such as, for example, a hybrid integrated circuits, and are required to be large in heat radiation capability so as to cope with increasing components per a single substrate. An aluminum nitride substrate was proposed as an essential part of the insulating substrate because the aluminum nitride is larger in thermal conductivity than an aluminum oxide widely used, however, various drawbacks have been encountered in the insulating substrate of aluminum nitride.

Namely, the aluminum nitride is less adhesive with respect to the circuit pattern of a thick film circuit, and, for this reason, the pattern is liable to peel from the insulating substrate. Various surface films are proposed for solving the drawback inherent in the aluminum nitride substrate. First, Japanese Patent Application laid-open (Kokai) No. 62-28847 discloses the structure of an insulating substrate which has a surface film of silicon dioxide. The insulating substrate consists of a foundation of aluminum nitride produced through a sintering process and the surface film of silicon dioxide provided on the major surface of the foundation. The surface film is formed by using a sputtering technique, a sol-gel technique or a photo-assisted chemical vapor deposition technique. On the insulating substrate thus fabricated are printed conductive paste and resistive paste which are fired to form conductive and resistive films, the printing stage and the firing stage are repeated to form conductive and resistive strips which form in combination a circuit pattern. Semiconductor chips and discrete component elements are arranged on the circuit pattern, and a thick film circuit is completed and installed in an electronic system. However, the surface film of silicon dioxide thus provided on the aluminum nitride foundation is less effective for preventing the circuit pattern from peeling off.

Another surface film is disclosed in U.S. Pat. No. 4,659,611. The surface film disclosed in the U.S. Patent is formed of aluminum oxide ($Al_2O_3$) and covers an aluminum nitride foundation. The surface film is formed through, for example, an oxidation stage of the foundation. However, the aluminum oxide surface film hardly provides any drastic solution of the drawback, and the circuit pattern tends to peel from the insulating substrate.

Applicants of this application have contemplated these drawbacks and, especially, studied the reasons why those surface films could not sufficiently improve the adhesion between the aluminum nitride foundation and the circuit pattern. The study resulted in Japanese Patent Application Nos. 63-21579, 63-21580 and 63-24628 which provided the basis of U. S. Patent application Ser. No. 07/304,460. Namely, Applicants found that silicon oxide enhanced the viscosity of the melted frits contained in the paste by supplying with viscous silicon atoms but was consumed by the frits which reacted with aluminum nitride in a high temperature ambient such as the firing stage. As a result of the chemical reaction between the aluminum nitride and the frits, undesirable gases such as nitrogen ($N_2$) gas or nitrogen oxide ($NO_2$) gas were produced, and such undesirable gases formed bubbles between the aluminum nitride foundation and the circuit pattern. The bubbles were causative of not only peeling off but also deterioration in heat radiation. If the surface film is thick enough to be left on the aluminum nitride foundation, the insulating substrate is so small in heat radiation capability that a high integration density hybrid circuit is hardly fabricated thereon because the silicon dioxide is so small in heat conductivity. In fact, the heat conductivity of the silicon dioxide is about 0.004 cal/sec. cm. deg., but the aluminum nitride is as large as 0.617 cal/sec. cm. deg.

On the other hand, the aluminum oxide was so porous that the melted frits easily penetrated through the porous aluminum oxide. In fact, the porocity is as large as 0.5% to 15%. The frits thus contacted with the aluminum nitride reacted therewith, and, accordingly, produced the foamable gases. This resulted in reduction of the adhesion between the surface film and the circuit pattern. In the U.S. Patent Application previously filed proposes a multilevel surface film structure which aims at improvement in the adhesion with respect to the circuit pattern.

Applicant further proposes in Japanese Patent Application No. 1-25336 filed on Feb. 3, 1989 an insulating substrate comprising an insulating foundation of aluminum nitride containing yttrium oxides and/or calcium oxides, an aluminum oxide film and a silicon oxide film, and the insulating substrate is improved in mechanical strength as well as in resistance to peeling force. The Japanese Patent Application provides a part of the basis of U. S. Patent Application in the name of KUROMITSU et al filed on Feb. 5, 1990, Ser. No. 07/474,904.

SUMMARY OF THE INVENTION

It is an important object of the present invention to provide an insulating substrate which has a multi-level surface film structure thin enough to improve the heat radiation capability without any sacrifice of adhesion.

It is also an important object of the present invention to provide a multi-level surface film structure which is less consumable in the presence of glass frits but is effective to improve an adhesion of a circuit pattern.

It is still another important object of the present invention to provide a thick film circuit the circuit pattern of which is fixedly bonded to an insulating substrate with a large heat conductivity.

To accomplish these objects, the present invention proposes to form a film of a substance with a small reactivity with respect to glass frits contained in a conductive paste underneath an upper surface film of a substance with a large reactivity with respect to the glass frits.

The glass frits are large in basicity, and, therefore, a substance with a large acidity is much reactive with the glass frits, but a substance with a small acidity is less reactive. If a film of a substance with a small acidity is overlain by another film of a substance with a large acidity, melted glass frits rapidly reacts with the substance with the large acidity in, for example, a firing stage, and, therefore, the reactant enhances the viscosity of the melted glass frits and, accordingly, adhesion thereof. However, this results in rapid consumption of the substance with the large acidity, but the substance with the small acidity is less consumable. Thus, the substance with the small acidity is much liable to be left on the aluminum nitride foundation, and the glass frits are hardly brought into contact with the aluminum nitride. This results in that any undesirable bubble takes place between a foundation of aluminum nitride and a circuit pattern made from the conductive paste.

The total thickness of the two films are smaller than the thickness of a single film of the substance with the large acidity, and, therefore, the multi-level film structure is less causative of deterioration in the heat radiation capability of an insulating substrate rather than the single film of the substance with the large acidity without any sacrifice of the resistance against peeling force.

In accordance with one aspect of the present invention, there is provided an insulating substrate for a conductive pattern made from a paste containing at least one glass frit having at least one basic component, comprising: a) a foundation containing an aluminum nitride and incidental impurities; and b) a multi-level surface film structure provided between the foundation and the conductive pattern, in which the multi-level surface structure comprises a lower surface film provided on a surface of the foundation and containing an aluminum oxide and incidental impurities, an intermediate surface film provided on the lower surface film and containing a substance having a relatively small acidity and incidental impurities, and an upper surface film provided on the intermediate surface film and containing a substance having a relatively large acidity and incidental impurities.

Silicon dioxide, boron oxide, phosphorus oxide, germanium oxide, arsenic oxide, selenium oxide, tin oxide, tellurium oxide, sulfur oxide and antimony oxide may be the substances with large reactivity with respect to the glass frits, and zirconium dioxide, titanium oxide, aluminum oxide and magnesium oxide, calcium oxide, strontium oxide yttrium oxide, barium oxide may be the substances with small reactivity with respect to the glass frits. Various glass frits are well known in the person skilled in the art, and a large number of the glass frits have respective basic components. For this reason, no further description is made on the glass frits for the sake of simplicity.

In accordance with another aspect of the present invention, there is provided a multi-level surface film structure forming a part of an insulating substrate and provided on a surface of a foundation, comprising: a) a lower surface film provided on a surface of the foundation and containing an aluminum oxide and incidental impurities; b) an intermediate surface film provided on the lower surface film and containing a substance having a relatively small acidity and incidental impurities; and c) an upper surface film provided on the intermediate surface film and containing a substance having a relatively large acidity and incidental impurities.

In accordance with still another aspect of the present invention, there is provided a thick film circuit comprising: a) an insulating substrate having a-1) a foundation containing an aluminum nitride and incidental impurities, a-2) a lower surface film provided on a surface of the foundation and containing an aluminum oxide and incidental impurities, a-3) an intermediate surface film provided on the lower surface film and containing a substance having a relatively small acidity and incidental impurities, and a-4) an upper surface film provided on the intermediate surface film and containing a substance having a relatively large acidity and incidental impurities; and b) a conductive circuit pattern provided on the upper surface film and made from a paste containing a glass frit having at least one basic component and c) a plurality of circuit components.

BRIEF DESCRIPTION OF THE DRAWINGS

The features and advantages of an insulating substrate for a thick film circuit according to the present invention will be more clearly understood from the following description taken in conjunction with the accompanying drawings in which.

DESCRIPTION OF THE PREFERRED EMBODIMENTS

First Embodiment

Figure 1:
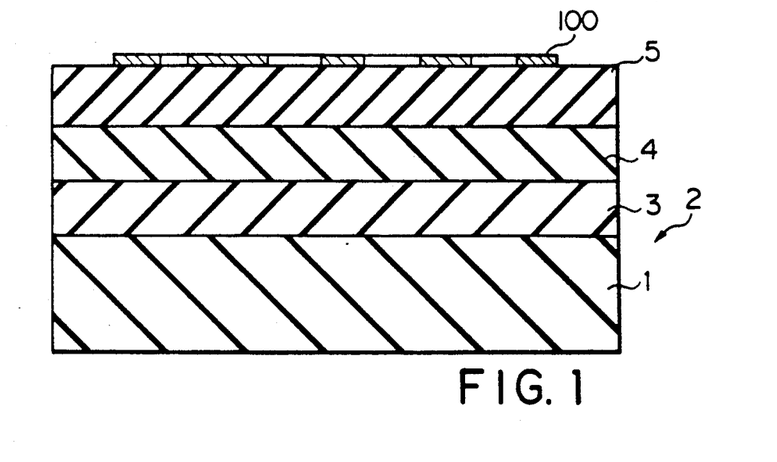
FIG. 1 is a cross sectional view showing the structure of an insulating substrate embodying the present invention.

Referring first to FIG. 1 of the drawings, an insulating substrate embodying the present invention comprises a foundation 1 and a multi-level surface film structure 2, and the multi-level surface film structure 2 has a lower surface film 3 covering the foundation 1, an intermediate surface film 4 formed on the lower surface film 3 and an upper surface film 5 provided on the intermediate surface film 4. A conductive circuit pattern 100 is formed on the upper surface film, and the conductive circuit pattern 100 is completed through repetition of a printing stage of a conductive paste and a firing stage. The conductive paste, by way of example, contains a lead oxide and/or a bismuth oxide, and these oxides are known as glass frits with large basicity.

In this instance, the foundation 1 is made of an aluminum nitride (AlN) containing an yttrium oxide ($Y_2O_3$) and/or a calcium oxide (CaO), and the yttrium oxide and/or the calcium oxide serves as oxidizing agent. The oxidizing agent ranges from about 0.1% to about 10% by weight. However, the foundation 1 may not contain any oxidizing agent. The lower surface film 3 is formed of an aluminum oxide ($Al_2O_3$) and ranges from about 0.2 microns to about 15 microns. The intermediate level surface film 4 is formed of a zirconia ($ZrO_2$) and has a thickness of about 0.05 micron to about 1 micron. The upper surface film 5 is made of silicon dioxide ($SiO_2$) and fallen within a range from about 0.05 micron to about 1 micron. Each of the films 1, 3, 4 and 5 may contain some incidental impurities.

The foundation 1 is produced through a sintering process, and is partially oxidized so that the lower surface film 3 is formed on the foundation 1. The aluminum oxide is thermally grown in an oxidizing ambient where oxygen partial pressure ranges from $10^{-2}$ atmosphere to about 1 atmosphere, the partial pressure of water vapor is equal to or less than about $10^{-3}$ atmosphere and the temperature is fallen within a range between about 1100 degrees and about 1500 degrees in centigrade. However, the intermediate surface film 4 and the upper surface film 5 are deposited by using either sol-gel technique or sputtering technique.

The oxidizing agent accelerates the formation of the lower surface film 3 of the aluminum oxide, and the rapid formation of the lower surface film 3 improves the throughput of an oxidizer. The foundation 1 per se is increased in mechanical strength because the oxidizing agent promotes the sintering. However, if the content of the oxidizing agent is less than 0.1% by weight, any acceleration and promotion hardly take place. On the other hand, if the content of the oxidizing agent exceeds 10% by weight, such a large amount of the oxidizing agent deteriorates the heat conductivity of the foundation 1.

The reasons why the lower surface film 3 ranges from about 0.2 micron to about 15 microns are that an aluminum oxide film less than 0.2 micron merely produces poor adhesion due to penetration of the glass frits and that an aluminum oxide film greater than 15 microns is too thick to effectively propagate heat toward the foundation 1.

The total thickness of the intermediate and upper surface films 4 and 5 depends on the number of the firing stages carried out in the formation process of the conductive pattern 100. The upper surface film 5 is firstly consumed in the early firing stages, and the intermediate surface film 4 is, then, consumed by the melted glass frits. If the integration density of circuit components is increased, the insulating substrate tends to be repeatedly subjected to the firing stage for formation of a complicated circuit pattern, and, for this reason, the total thickness of the intermediate and upper surface films 4 and 5 should be increased so as to prevent the foundation 1 from the melted glass frits. By the way, in this description, "integration density" means the number of circuit components per a unit area of an insulating substrate. However, when the insulating substrate shown in FIG. 1 is used for a hybrid circuit with a high integration density as of now, the intermediate surface film 4 ranges between about 0.05 micron and about 1 micron on the assumption that the upper surface film 5 also ranges between about 0.05 micron and about 1 micron The assumption is reasonable because a silicon dioxide film less than about 0.05 micron is easily consumed in an early stage of the formation process for a conductive circuit pattern with an ordinary integration density but a silicon dioxide film greater than 1 micron deteriorates the heat radiation capability of the insulating substrate 1. The range of the intermediate surface film 4 is also reasonable in view of consumption in the ordinary process as well as of propagation of heat. If a zirconia film less than about 0.05 micron is overlain by the upper surface 5 in the above described range, the glass frits easily consume the zirconia film and tend to be brought into contact with the foundation 1, thereby forming bubbles due to nitrogen gas or a nitrogen oxide gas. On the other hand, a zirconia film greater than about 1 micron is hardly consumed by the glass frits during the formation process, and, accordingly, is left on the foundation 1. However, since the zirconia is small in heat conductivity, the zirconia film thus left on the foundation deteriorates the heat radiation capability of the insulating substrate.

The zirconia is small in acidity than silicon dioxide, and the glass frits are large in basicity. In other words, the silicon dioxide is much reactive with the glass frits than the zirconia, and, for this reason, the total thickness of the intermediate and upper surface films 4 and 5 is smaller than that of a silicon dioxide film which may be provided between the foundation 1 and the conductive circuit pattern 100.

Description is hereinbelow made on a process of fabricating the insulating substrate according to the present invention. The process starts with preparation of ingredient powders of yttrium oxide ($Y_2O_3$), calcium oxide (CaO) and aluminum nitride (AlN), and these ingredient powders are about 1 micron to about 3 microns in average diameter. A target, solutions and a gaseous mixture used for formation of the intermediate surface film 4 and the upper surface film 5 will be described hereinafter.

The ingredient powders are regulated and mixed by using a wet ball-mil for about seventy two hours so as to obtain various mixtures different in proportion from one another. The mixtures are dried, and an organic binder is added to the mixtures so that pastes are produced in various proportions. The mixture with the oxidizing agent or agents are shaped into green sheets by using a doctor-blade technique, and the green sheets are placed in a nitrogen ambient with an atmospheric pressure at about 1800 degrees in centigrade for about 2 hours. The green sheets thus sintered are produced into insulating foundations with compositions indicated in Table 1. The insulating foundations have respective top surfaces each measuring 25.4 millimeter by 25.4 millimeter and are about 0.625 millimeter in thickness. The insulating foundations thus produced are labeled with reference marks P1 to P6 and C1 to C4.

The insulating foundations labeled with reference marks P1 to P6 are used for fabrication of insulating substrates according to the present invention, but insulating substrates out of the scope of the present invention are fabricated on the foundations labeled with reference marks C1 to C3 for comparison. An insulating substrate fabricated on the foundation C4 is less effective against heat as will be described hereinafter.

TABLE 1

| Reference mark | Composition (by weight %) | | |
|---|---|---|---|
| | $Y_2O_3$ | CaO | AlN |
| P1 | 0.1 | None | Residual |
| P2 | 4 | None | Residual |
| P3 | 8 | None | Residual |
| P4 | None | 0.1 | Residual |
| P5 | None | 7 | Residual |
| P6 | 0.5 | 0.5 | Residual |
| C1 | 2 | None | Residual |
| C2 | None | 7 | Residual |
| C3 | 0.5 | 0.5 | Residual |
| C4 | None | 3 | Residual |

After the formation of the foundation P1 to P6 and C1 to C4, the foundations are placed in respective oxidizing ambiences, and the aluminum nitride is promptly oxidized in the presence of the oxidizing agent. Thus, the aluminum oxide ($Al_2O_3$) is grown on the surfaces of the foundations P1 to P6 and C1 to C4, and respectively provides the lower surface films thereon.

TABLE 2

| | The lower surface film of $Al_2O_3$ | | | |
|---|---|---|---|---|
| Reference mark | $O_2$ Press. (atm.) | Oxidation Vapor Press. (atm.) | Temp. (deg.) | Thickness (micron) |
| P1 | 1.0 | $1 \times 10^{-5}$ | 1350 | 0.2 |
| P2 | " | " | " | 3.2 |
| P3 | 0.5 | $1 \times 10^{-4}$ | 1400 | 2.5 |
| P4 | " | " | " | 7.9 |
| P5 | 0.1 | $1 \times 10^{-3}$ | 1450 | 0.7 |
| P6 | " | " | " | 4.3 |
| C1 | 1.0 | $1 \times 10^{-5}$ | 1350 | 1.5 |
| C2 | " | " | " | 15.0 |
| C3 | 0.5 | $1 \times 10^{-4}$ | 1400 | 3.2 |

TABLE 2-continued

| | The lower surface film of $Al_2O_3$ | | | |
|---|---|---|---|---|
| Reference mark | $O_2$ Press. (atm.) | Oxidation Vapor Press. (atm.) | Temp. (deg.) | Thickness (micron) |
| C4 | 0.1 | $1 \times 10^{-3}$ | 1450 | 0.5 |

The oxidations are followed by formation of the intermediate surface film on the respective lower surface films. Various techniques are available for formation of the upper surface films, however, a sputtering technique or a sol-gel technique are applied to those specimens P1 to P6 and C $\propto$ 4. The comparative foundations C1 to C3 are directly covered with silicon oxide films through either technique, and no intermediate surface film is inserted between the lower surface films and the upper surface films.

A sintered zirconia target with purity of about 99% is prepared for the sputtering, and the sintered zirconia target is about 3 millimeters in diameter and about 10 millimeters in height. The target is installed in an RF sputtering system, and the foundations P2, P4, P6 and C4 covered with the lower surface films are confronted with the sintered zirconia target. The foundations P2, P4, P6 and C4 are rotated at about 10 rpm, and the sputtering is carried out at about 70 watts for respective time period depending upon the thickness of the intermediate surface film.

In the sol-gel coating, dipping into a colloidal solution and a drying stage are repeated a predetermined times, and the predetermined times depend upon the thickness of each intermediate surface film. The colloidal solution is prepared by mixing the 1500 grams of isopropyl alcohol and 600 grams of zirconium tetrabutoxyd. The foundations P1, P3 and P5 thus formed with laminated films are placed in a high temperature atmospheric ambient at about 1000 degrees in centigrade for about 1 hour, then the laminated films are fired so that the intermediate surface films are produced on the respective lower surface films. In this instance, the dipping is used, but a spray coating may be available. The formation of the intermediate films are summarized in Table 3.

TABLE 3

| Reference mark | The intermediate surface film Formation technique | Thickness (micron) |
|---|---|---|
| P1 | Sol-gel | 0.05 |
| P2 | Sputtering | 0.72 |
| P3 | Sol-gel | 0.06 |
| P4 | Sputtering | 0.26 |
| P5 | Sol-gel | 0.91 |
| P6 | Sputtering | 0.32 |
| C1 to C3 | None | None |
| C4 | Sputtering | 1.7 |

The upper surface films are, then, formed on the respective intermediate surface films or directly on the respective lower surface films, and a sputtering technique or a sol-gel technique is used for formation of the upper surface films again.

A quartz target with purity of about 99.9% is prepared for the sputtering, and the quartz target is about 3 millimeters in diameter and about 10 millimeters in height. The target is installed in an RF sputtering system, and the foundations with the lower and intermediate surface films are confronted with the quartz target. The foundations are rotated at about 10 rpm, and the sputtering is carried out at about 100 watts for respective time period depending upon the thickness of the intermediate surface film.

In the sol-gel coating, the foundations are dipped into a colloidal solution and, then, dried. The dipping stage and the drying stage are repeated a predetermined times, and the predetermined times depend upon the thickness of each intermediate surface film. The colloidal solution is prepared by mixing the 500 grams of ethyl alcohol and 250 grams of ethyl silicate. The foundations thus formed with laminated films are placed in a high temperature atmospheric ambient at about 1000 degrees in centigrade for about 1 hour, then the laminated films are fired so that the upper surface films are produced on the respective intermediate surface films. In this instance, the dipping is used, but a spray coating may be available. The formation of the upper films are summarized in Table 4.

TABLE 4

| Reference mark | The upper surface film Formation technique | Thickness micron |
|---|---|---|
| P1 | Sol-gel | 0.05 |
| P2 | " | 0.64 |
| P3 | " | 0.65 |
| P4 | Sputtering | 0.12 |
| P5 | Sol-gel | 0.36 |
| P6 | " | 0.87 |
| C1 | Sputtering | 0.05 |
| C2 | Sol-gel | 0.10 |
| C3 | Sputtering | 1.00 |
| C4 | Sputtering | 0.10 |

Figure 2:
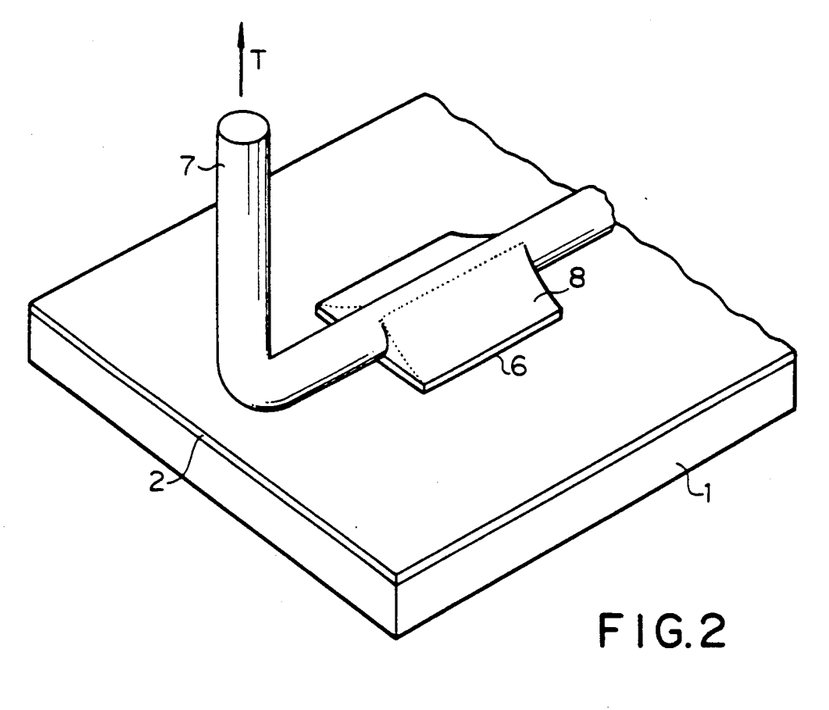
FIG. 2 is a perspective view showing, in a modeled form, a measuring instrument for a resistance against peeling force achieved by a surface film structure.

The heat conductivity of the insulating substrates (which are also labeled with the reference marks P1 to P6 and C1 to C4, respectively) are measured by using a laser flashing technique, and peeling resistances or peeling strengths are further measured for evaluation of bonding forces between the multi-level surface film structures 2 and the circuit patterns, respectively, by using the following arrangement. Namely, a conductive paste formed from a palladium alloy powder containing 20% silver by weight is screen printed on the insulating substrates P1 to P6 and C1 to C4, and each paste thus printed occupies an area of about 2 millimeters by about 2 millimeters. The square shaped paste films are dried at 125 degrees in centigrade for about 10 minutes, and are, then, fired at about 850 degrees in centigrade for about 10 minutes. The firing is repeated nine times so that paste films 6 are produced on the upper surface films 5, respectively. Then, the paste films 6 are subjected to the heat application ten times. On each of the paste films 6 is placed a generally L-shaped oxygen free copper wire 7 which is soldered to the paste film 6 at about 215 degrees in centigrade. The oxygen free copper wire 7 is about 0.9 millimeter in diameter, and a tin-lead eutectic crystal solder 8 is used for bonding. The oxygen free copper wire 7 is pulled in a direction indicated by arrow T, and the force is gradually increased until the paste film 6 peels from the insulating substrate. The maximum force is divided by the occupying area of the paste film 5, and the force per unit area is defined as "peeling strength".

The heat conductivities and the peeling strengths are indicated in Table 5 for the individual insulating substrates P1 to P6 and C1 to C4. As will be understood from Table 4, the peeling strength of each insulating substrate according to the present invention is roughly three times larger than that of the comparative insulating substrate without any substantial sacrifice of the heat conductivity.

TABLE 5

| Reference mark | Heat Conductivity (cal/sec. cm. deg) | Peeling strength (kg/4 mm²) |
|---|---|---|
| P1 | 0.510 | 4.0 |
| P2 | 0.500 | 4.1 |
| P3 | 0.501 | 4.2 |
| P4 | 0.513 | 4.0 |
| P5 | 0.510 | 4.2 |
| P6 | 0.500 | 4.6 |
| C1 | 0.482 | 1.2 |
| C2 | 0.465 | 1.7 |
| C3 | 0.471 | 1.8 |
| C4 | 0.392 | 4.1 |

The specimens in Table 1 to 5 have the respective intermediate surface films 4 of the zirconia, however, some substances with small acidities are available, and a titanium oxide, an aluminum oxide, a magnesium oxide, a calcium oxide, a strontium oxide, an yttrium oxide and a barium oxide are the substances with small acidities by way of example. A boron oxide, a phosphorus oxide, a germanium oxide, an arsenic oxide, a selenium oxide, a tin oxide, an antimony oxide, a tellurium oxide and a sulfur oxide are of the substance with a large acidity. Any combination between the substance with a small acidity and the substance with a large acidity is advantageous in retarding the consumption of the surface film structure and, accordingly, in the heat conductivity due to reduction in the thickness.

Figure 3:
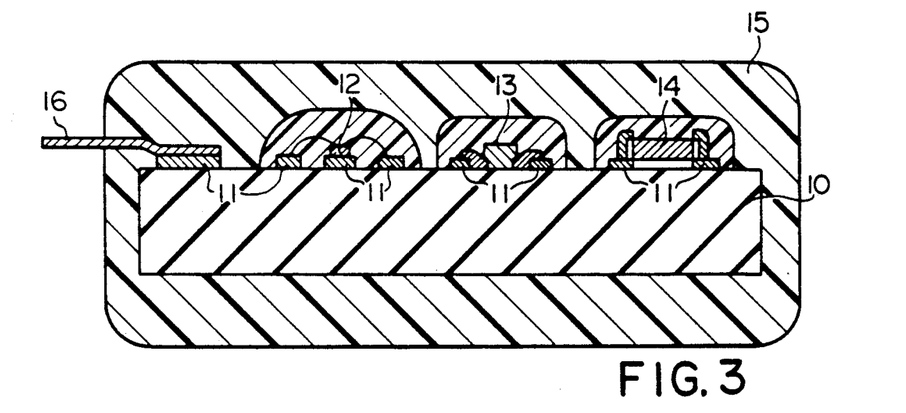
FIG. 3 is a cross sectional view showing the structure of a hybrid integrated circuit fabricated on the insulating substrate according to the present invention.

The insulating substrate according to the present invention is suitable for a hybrid integrated circuit by way of example. FIG. 3 shows the structure of a hybrid integrated circuit which is fabricated on an insulating substrate 10 according to the present invention. On the insulating substrate 10 is formed a conductive pattern 11 which provides interconnections between a single chip integrated circuit 12, a resistive pattern 13 and another chip element 14. The component elements 12 to 14 thus mounted on the insulating substrate 10 are sealed in a synthetic resin 15, and outer leads are projected from the synthetic resin 13 for communication with a external system (not shown). One of the outer leads is shown and designated by reference numeral 16.

The insulating substrate according to the present invention per se provides a rigid circuit substrate of an electric or electronic circuit, however, a multi-level circuit substrate may be fabricated by using a plurality of insulating substrates according to the present invention. Namely, a circuit pattern is formed on each of the insulating substrates, and an adhesive paste is prepared by mixing a glass powder such as, for example, boron-silicate glass and an organic binder. The adhesive paste is printed on the insulating substrates, and the insulating substrates thus printed with the adhesive paste are laminated to form a multi-level structure. The multi-level structure is heated to a certain temperature over the softening point of the glass powder so that a multi-level circuit substrate is completed.

In order to form a conductive pattern on the insulating substrate according to the present invention, a paste is printed on the insulating substrate and, then, fired. The paste contains glass frits, and some of the frits have respective basic components, respectively, however, the frits are well known in the person skilled in the art, and, therefore, no further description is incorporated for the sake of simplicity.

Second Embodiment

A second embodiment of the present invention is similar in structure to the first embodiment shown in FIG. 1, and, for this reason, the component films and foundation are designated by the same reference numerals in the following description without any detailed description for the sake of simplicity. The foundation 1, the lower surface film 3 and the upper surface film 5 are similar in material and thickness to those of the first embodiment, but the intermediate surface film 4 contains not only the zirconia ($ZrO_2$) but also an aluminum oxide ($Al_2O_3$). The content of the aluminum oxide is larger than about 0.5% by weight. This is because of the fact that an intermediate surface film with an alumina content less than 0.5% hardly enhances the adhesion with respect to the lower surface film 3.

A fabrication process for the insulating substrate featuring the second embodiment is described herein below. The formation of the foundations P11 to P16 and C11 to C12 is similar to the first embodiment, and, for this reason, no detailed description is incorporated hereinbelow. However, the composition is indicated in Table 6.

TABLE 6

| Reference mark | Composition (by weight %) | | |
|---|---|---|---|
| | $Y_2O_3$ | CaO | AlN |
| P11 | 2 | None | Residual |
| P12 | 6 | None | Residual |
| P13 | 10 | None | Residual |
| P14 | None | 3 | Residual |
| P15 | None | 10 | Residual |
| P16 | 3 | 3 | Residual |
| C11 | 0.1 | None | Residual |
| C12 | 3 | 3 | Residual |

The lower films 3 are produced in a similar manner to those of the first embodiment, and the oxidizing ambiences are described in Table 7.

TABLE 7

| | The lower surface film of $Al_2O_3$ | | | |
|---|---|---|---|---|
| Reference mark | $O_2$ Press. (atm.) | Oxidation Vapor Press. (atm.) | Temp. (deg.) | Thickness (micron) |
| P11 | 1.0 | $1 \times 10^{-5}$ | 1350 | 1.5 |
| P12 | " | " | " | 15.0 |
| P13 | 0.5 | $1 \times 10^{-4}$ | 1400 | 5.6 |
| P14 | " | " | " | 14.0 |
| P15 | 0.1 | $1 \times 10^{-3}$ | 1450 | 1.6 |
| P16 | " | " | " | 13.2 |
| C11 | 0.5 | $1 \times 10^{-4}$ | 1400 | 7.8 |
| C12 | 0.1 | $1 \times 10^{-3}$ | 1450 | 6.4 | the intermediate surface films 4 are produced on the respective lower surface films 3 through a sputtering process or a sol-gel process. For the sputtering process, two targets are respectively formed of a sintered zirconia with purity of 99%, i.e. a sintered complex oxide of alumina and zirconia with zirconia content of about 1% by weight, and the sintered complex oxide is of a solid solution. Each of the targets is about 100 millimeters in diameter and about 10 millimeters in height. The targets are selectively installed in an RF sputtering system, and the foundations P11, P13, P15 and C12 covered with the respective lower surface films are confronted with the targets. The foundations P11, P13, P15 and C12 are rotated at about 10 rpm, and each sputtering is carried out at about 70 watts for a time period depending upon the thickness of the intermediate surface film 4.

In the sol-gel coating, dipping into either colloidal solution and a drying stage are repeated a predetermined times, and the predetermined times depend upon the thickness of each intermediate surface film. The colloidal solutions are prepared by mixing 500 grams of ethyl alcohol and 250 grams of ethyl silicate and by mixing 1500 grams of isopropyl alcohol, 350 grams of zirconium tetrabutoxyd and 150 grams of aluminium-diisopropyleto-monobutyleto. The foundations P12, P14, P16 and C11 thus formed with laminated films are placed in a high temperature atmospheric ambient at about 1000 degrees in centigrade for about 1 hour, then the laminated films are fired so that the intermediate surface films 4 are produced on the respective lower surface films. The formation of the intermediate films are summarized in Table 8.

TABLE 8

| Reference mark | The intermediate surface film | | | Thickness (micron) |
|---|---|---|---|---|
| | Process | Composition (WT %) | | |
| | | Zirconia | Alumina | |
| P11 | Sputtering | 99 | 1 | 0.53 |
| P12 | Sol-gel | 70 | 30 | 0.06 |
| P13 | Sputtering | 99 | 1 | 0.12 |
| P14 | Sol-gel | 70 | 30 | 0.86 |
| P15 | Sputtering | 99 | 1 | 0.26 |
| P16 | Sol-gel | 70 | 30 | 0.56 |
| C11 | Sol-gel | 70 | 30 | 2.5 |
| C12 | Sputtering | 99 | 1 | 3.2 |

The upper surface films 5 are produced on the respective intermediate surface films 4 in a similar manner to those of the first embodiment, so that the formation process and the thickness of each upper surface film 5 is reported in Table 9.

TABLE 9

| Reference mark | The upper surface film Formation technique | Thickness (micron) |
|---|---|---|
| P11 | Sol-gel | 0.42 |
| P12 | " | 1.00 |
| P13 | Sputtering | 0.07 |
| P14 | Sol-gel | 0.26 |
| P15 | " | 0.41 |
| P16 | " | 0.72 |
| C11 | " | 0.53 |
| C12 | " | 0.05 |

The thermal conductivities of the insulating substrates (which are also labeled with the reference marks P11 to P16 and C11 to C12, respectively) are measured by using the laser flashing technique, and peeling resistances or peeling strengths are further measured for evaluation of bonding forces between the multi-level surface film structures 2 and the circuit patterns, respectively, by using the arrangement shown in FIG. 2 under the conditions described in conjunction with the first embodiment. The results are summarized in Table 10.

TABLE 10

| Reference mark | Heat Conductivity (cal/sec. cm. deg) | Peeling strength (kg/4 mm$^2$) |
|---|---|---|
| P11 | 0.506 | 4.1 |
| P12 | 0.515 | 4.6 |
| P13 | 0.512 | 4.7 |
| P14 | 0.511 | 4.9 |
| P15 | 0.506 | 4.6 |
| P16 | 0.500 | 5.1 |
| C11 | 0.374 | 4.0 |

TABLE 10-continued

| Reference mark | Heat Conductivity (cal/sec. cm. deg) | Peeling strength (kg/4 mm$^2$) |
|---|---|---|
| C12 | 0.354 | 3.9 |

The specimens in Tables 6 to 10 have the respective intermediate surface films 4 each containing the zirconia and the aluminum oxide, however, some substances with small acidities are available, and a titanium oxide, an aluminum oxide, a magnesium oxide, a calcium oxide, a strontium oxide, an yttrium oxide and a barium oxide are the substances with small acidities by way of example. A boron oxide, a phosphorus oxide, a germanium oxide, an arsenic oxide, a selenium oxide, a tin oxide, an antimony oxide, a tellurium oxide and a sulfur oxide are of the substance with a large acidity.

As will be understood from Table 10, the insulating substrates P11 to P16 according to the present invention are larger in peeling strength than the prior art examples C1 to C3 of Table 5, and each heat conductivity is slightly lowered with respect to those of the prior art examples C1 to C3. Thus, the present invention is advantageous over the prior art in the peeling strength without any substantial deterioration in heat conductivity. The insulating substrates C11 and C12 are not so large in heat conductivity because the intermediate surface films 4 exceeds the recommendable range, i.e. from 0.05 micron to 1 micron in thickness.

The insulating substrate thus featured by the intermediate surface film 4 of the complex oxide of the zirconia and the alumina is also used for a multi-level insulating substrate as similar to the first embodiment.

Third Embodiment

A third embodiment of the present invention is also similar in structure to the first embodiment shown in FIG. 1, and, for this reason, detailed description is omitted for the sake of simplicity, but the components are accompanied with the same reference numerals, respectively.

In the third embodiment, the foundation 1 and the lower surface film 3 are similar in the material and in the thickness to those of the first embodiment, and the intermediate surface film 4 is formed of a complex oxide of a zirconia ($ZRO_2$) and an alumina ($Al_2O_3$). The thickness of the intermediate surface film 4 of the third embodiment is fallen within a range between about 0.05 micron and about 1 micron, and the alumina content is larger than about 0.5% by weight. The reasons for the recommendable thickness and the alumina content are similar to those described in connection with the intermediate surface film of the second embodiment.

The third embodiment is characterized by the upper surface film 5 which contains a silicon oxide ($SiO_2$) and a boron oxide ($B_2O_3$). The content of the boron oxide ranges from about 5% to about 50% by weight, and the thickness of the upper surface film 5 ranges from about 0.01 micron to about 1 micron. The boron oxide is large in acidity and, accordingly, in reactivity with respect to the glass frits, and, therefore, enhances the adhesion of the conductive paste. However, if the content is less than about 5% by weight, the boron oxide is less effective in view of the enhancement of the adhesion. The boron oxide greater than 50% is unstable in the atmospheric ambient because of vapor contained in the air. An upper surface film less than 0.01 micron hardly enhances the adhesion of the circuit pattern 100. If the upper surface film 5 exceeds 1 micron, the insulating substrate hardly propagates heat produced by circuit components, and, therefore, the circuit pattern 100 and the circuits components tend to increase in temperature.

Description is made on a fabrication process for the insulating substrate featuring the third embodiment. The formation of the foundations P21 to P33 and C21 to C33 is similar to the first embodiment, and, for this reason, no detailed description is incorporated hereinbelow. However, the compositions are indicated in Tables 11A and 11B.

TABLE 11A

| Reference mark | Composition (by weight %) | | |
|---|---|---|---|
| | $Y_2O_3$ | CaO | AlN |
| P21 | 0.1 | None | Residual |
| P22 | 2 | None | Residual |
| P23 | 4 | None | Residual |
| P24 | 6 | None | Residual |
| P25 | 8 | None | Residual |
| P26 | 10 | None | Residual |
| P27 | None | 0.1 | Residual |
| P28 | None | 3 | Residual |
| P29 | None | 7 | Residual |
| P30 | None | 10 | Residual |
| P31 | 0.5 | 0.5 | Residual |
| P32 | 2.5 | 2.5 | Residual |
| P33 | 6 | 3 | Residual |

TABLE 11B

| Reference mark | Composition (by weight %) | | |
|---|---|---|---|
| | $Y_2O_3$ | CaO | AlN |
| C21 | 0.1 | None | Residual |
| C22 | 2 | None | Residual |
| C23 | 6 | None | Residual |
| C24 | 8 | None | Residual |
| C25 | None | 0.1 | Residual |
| C26 | None | 3 | Residual |
| C27 | None | 7 | Residual |
| C28 | None | 10 | Residual |
| C29 | 0.5 | 0.5 | Residual |
| C30 | 2.5 | 2.5 | Residual |
| C31 to C33 | None | None | 100 |

The lower films 3 are produced in a similar manner to those of the first embodiment, and the oxidizing ambiences are described in Tables 12A and 12B.

TABLE 12A

| | The lower surface film of $Al_2O_3$ | | | |
|---|---|---|---|---|
| Reference mark | $O_2$ Press. (atm.) | Oxidation Vapor Press. (atm.) | Temp. (deg.) | Thickness (micron) |
| P21 | 1.0 | $1 \times 10^{-5}$ | 1350 | 0.2 |
| P22 | " | " | " | 2.3 |
| P23 | " | " | " | 4.6 |
| P24 | " | " | " | 11.2 |
| P25 | " | " | " | 15.0 |
| P26 | 0.5 | $1 \times 10^{-4}$ | 1400 | 0.9 |
| P27 | " | " | " | 1.9 |
| P28 | " | " | " | 5.5 |
| P29 | " | " | " | 13.1 |
| P30 | 0.1 | $1 \times 10^{-3}$ | 1450 | 0.7 |
| P31 | " | " | " | 3.6 |
| P32 | " | " | " | 7.9 |
| P33 | " | " | " | 11.6 |

TABLE 12B

| | The lower surface film of $Al_2O_3$ | | | |
|---|---|---|---|---|
| Reference mark | $O_2$ Press. (atm.) | Oxidation Vapor Press. (atm.) | Temp. (deg.) | Thickness (micron) |
| C21 | 1.0 | $1 \times 10^{-5}$ | 1350 | 0.1 |

TABLE 12B-continued

| | The lower surface film of $Al_2O_3$ | | | |
|---|---|---|---|---|
| Reference mark | $O_2$ Press. (atm.) | Oxidation Vapor Press. (atm.) | Temp. (deg.) | Thickness (micron) |
| C22 | " | " | " | 19.5 |
| C23 | " | " | " | 11.2 |
| C24 | " | " | " | 15.0 |
| C25 | 0.5 | $1 \times 10^{-4}$ | 1400 | 1.9 |
| C26 | " | " | " | 0.9 |
| C27 | " | " | " | 13.1 |
| C28 | 0.1 | $1 \times 10^{-3}$ | 1450 | 0.7 |
| C29 | " | " | " | 3.6 |
| C30 | " | " | " | 7.9 |
| C31 to C33 | | | | None |

The intermediate surface films 4 are produced on the respective lower surface films 3 through a sputtering process or a sol-gel process. For the sputtering process, four targets are prepared, i.e. a target of a sintered zirconia ($ZRO_2$) with a purity of 99%, a target of a sintered oxide of alumina and zirconia with alumina content about 1% by weight, a target of a sintered oxide of alumina and zirconia with alumina content of about 20% by weight, and a sintered oxide of alumina and zirconia with alumina content of about 38% by weight. The sintered oxides are of a solid solution. Each of the targets is about 100 millimeters in diameter and about 10 millimeter in height. The targets are selectively installed in an RF sputtering system, and the foundations P24, P26, P28, P32, P33, C23, C26 and C30 covered with the respective lower surface films are confronted with the targets. The foundations P24, P26, P28, P32, P33, C23, C26 and C30 are rotated at about 10 rpm, and each sputtering is carried out at about 70 watts for a time period depending upon the thickness of the intermediate surface film 4.

In the sol-gel coating, dipping into either colloidal solution and a drying stage are repeated a predetermined times, and the predetermined times depend upon the thickness of each intermediate surface film. The colloidal solutions are prepared by mixing a first solution of 1500 grams of isopropyl alcohol and 600 grams of zirconium tetrabutoxyd and a second solution of 1500 grams of isopropyl alcohol and 150 grams of aluminium-diisopropyletomonobutyleto. The foundations P21 to P23, P25, P27, P29 to P31, C21, C22, C24, C25 and C27 to C29 thus formed with laminated films are placed in a high temperature atmospheric ambient at about 1000 degrees in centigrade for about 1 hour, then the laminated films are fired so that the intermediate surface films 4 are produced on the respective lower surface films. The formation of the intermediate films are summarized in Tables 13A and 13B.

TABLE 13A

| | The intermediate surface film | | | |
|---|---|---|---|---|
| Reference mark | Process | Composition (% WT) | | Thickness (micron) |
| | | Alumina | Zirconia | |
| P21 | Sol-gel | 1.2 | Residual | 0.05 |
| P22 | Sol-gel | 9.0 | Residual | 0.09 |
| P23 | Sol-gel | 21.1 | Residual | 0.31 |
| P24 | Sputtering | 1.0 | Residual | 0.76 |
| P25 | Sol-gel | 39.6 | Residual | 0.98 |
| P26 | Sputtering | 20.4 | Residual | 0.21 |
| P27 | Sol-gel | 8.7 | Residual | 0.61 |
| P28 | Sputtering | 0.6 | Residual | 0.83 |
| P29 | Sol-gel | 39.1 | Residual | 0.90 |
| P30 | Sol-gel | 0.8 | Residual | 0.06 |
| P31 | Sol-gel | 21.2 | Residual | 0.12 |
| P32 | Sputtering | 34.2 | Residual | 0.36 |

TABLE 13A-continued

| Reference mark | The intermediate surface film | | | Thickness (micron) |
|---|---|---|---|---|
| | Process | Composition (% WT) | | |
| | | Alumina | Zirconia | |
| P33 | Sputtering | 20.3 | Residual | 0.79 |

TABLE 13B

| Reference mark | The intermediate surface film | | | Thickness (micron) |
|---|---|---|---|---|
| | Process | Composition (% WT) | | |
| | | Alumina | Zirconia | |
| C21 | Sol-gel | 1.1 | Residual | 0.06 |
| C22 | Sol-gel | 9.2 | Residual | 0.09 |
| C23 | Sputtering | None | 100 | 0.75 |
| C24 | Sol-gel | 51.2 | Residual | 0.96 |
| C25 | Sol-gel | 8.9 | Residual | 0.02 |
| C26 | Sputtering | 0.7 | Residual | 2.13 |
| C27 | Sol-gel | 39.1 | Residual | 0.90 |
| C28 | Sol-gel | 0.8 | Residual | 0.06 |
| C29 | Sol-gel | 21.2 | Residual | 0.12 |
| C30 | Sputtering | 34.2 | Residual | 0.36 |
| C31 to C33 | — | — | — | None |

The upper surface films 5 are produced on the respective intermediate surface films 4 by using either sputtering or sol-gel technique. For the sputtering process, three targets are prepared, i.e. a target of a sintered silicon dioxide with a purity of 99.9%, a target of a sintered product of silica ($SiO_2$) and a boron oxide ($B_2O_3$) with silica content of about 10% by weight, and a target of a sintered product of the silica and the boron oxide with silica content of about 30% by weight. The sintered products are of a solid solution. Each of the targets is about 100 millimeters in diameter and about 10 millimeters in height. The targets are selectively installed in an RF sputtering system, and the foundations P21, P25, P27, P28, P33, C24 to C26 and C33 covered with the respective intermediate surface films are confronted with the targets. The foundations P21, P25, P27, P28, P33, C24 to C26 and C31 are rotated at about 10 rpm, and each sputtering is carried out at about 100 watts for a certain time period depending upon the thickness of the upper surface film 5.

In the sol-gel coating, dipping into either colloidal solution and a drying stage are repeated a predetermined times, and the predetermined times depend upon the thickness of each upper surface film. The colloidal solutions are prepared by mixing a first solution of 500 grams of ethyl alcohol and 250 grams of ethyl silicate and a second solution of 500 grams of ethyl alcohol and 100 grams of triethoxyborane. The foundations P22 to P24, P26, P29 to P32, C22, C23 and C27 to C32 thus formed with laminated films are placed in a high temperature atmospheric ambient at about 1000 degrees in centigrade for about 1 hour, then the laminated films are fired so that the upper surface films 5 are produced on the respective intermediate surface films 4 or directly on the foundations 1. The formation of the upper films 5 are summarized in Tables 9A and 9B.

TABLE 14A

| Reference mark | The upper surface film | | | Thickness (micron) |
|---|---|---|---|---|
| | Process | Composition (WT %) | | |
| | | $B_2O_3$ | $SiO_2$ | |
| P21 | Sputtering | 10.2 | Residual | 0.01 |
| P22 | Sol-gel | 5.1 | Residual | 0.24 |
| P23 | Sol-gel | 25.1 | Residual | 0.68 |
| P24 | Sol-gel | 49.2 | Residual | 0.92 |
| P25 | Sputtering | 30.1 | Residual | 1.00 |

TABLE 14A-continued

| Reference mark | The upper surface film | | | Thickness (micron) |
|---|---|---|---|---|
| | Process | Composition (WT %) | | |
| | | $B_2O_3$ | $SiO_2$ | |
| P26 | Sol-gel | 5.5 | Residual | 0.02 |
| P27 | Sputtering | 29.0 | Residual | 0.09 |
| P28 | Sputtering | 10.3 | Residual | 0.13 |
| P29 | Sol-gel | 24.6 | Residual | 0.70 |
| P30 | Sol-gel | 32.4 | Residual | 0.62 |
| P31 | Sol-gel | 42.4 | Residual | 0.45 |
| P32 | Sol-gel | 49.6 | Residual | 0.31 |
| P33 | Sputtering | 30.3 | Residual | 0.20 |

TABLE 14B

| Reference mark | The upper surface film | | | Thickness (micron) |
|---|---|---|---|---|
| | Process | Composition (WT %) | | |
| | | $B_2O_3$ | $SiO_2$ | |
| C21 | Sputtering | 10.6 | Residual | 0.01 |
| C22 | Sol-gel | 4.8 | Residual | 0.26 |
| C23 | Sol-gel | 47.9 | Residual | 0.90 |
| C24 | Sputtering | 31.2 | Residual | 0.98 |
| C25 | Sputtering | 29.4 | Residual | 0.09 |
| C26 | Sputtering | 10.0 | Residual | 0.12 |
| C27 | Sol-gel | 2.3 | Residual | 0.72 |
| C28 | Sol-gel | 59.2 | Residual | 0.65 |
| C29 | Sol-gel | 42.9 | Residual | 0.006 |
| C30 | Sol-gel | 49.3 | Residual | 1.6 |
| C31 | Sol-gel | None | 100 | 0.05 |
| C32 | Sol-gel | None | 100 | 5.2 |
| C33 | Sputtering | None | 100 | 9.8 |

The thermal conductivities of the insulating substrates (which are also labeled with the reference marks P21 to P33 and C21 to C33, respectively) are measured by using the laser flashing technique, and peeling resistances or peeling strengths are further measured for evaluation of bonding forces between the multi-level surface film structures 2 and the circuit patterns, respectively, by using the arrangement shown in FIG. 2. The thermal conductivities and the peeling resistances are measured immediately after the formation of the first conductive films and after the completion of the conductive patterns, respectively.

The results are summarized in Tables 10A to 10D.

TABLE 15A

| Reference mark | (1st film) | |
|---|---|---|
| | Heat Conductivity (cal/sec. cm. deg) | Peeling strength (kg/4 mm$^2$) |
| P21 | 0.621 | 4.0 |
| P22 | 0.601 | 4.3 |
| P23 | 0.587 | 4.5 |
| P24 | 0.512 | 4.9 |
| P25 | 0.410 | 5.1 |
| P26 | 0.611 | 5.0 |
| P27 | 0.602 | 4.7 |
| P28 | 0.596 | 4.2 |
| P29 | 0.588 | 4.3 |
| P30 | 0.444 | 4.2 |
| P31 | 0.561 | 4.5 |
| P32 | 0.531 | 4.4 |
| P33 | 0.431 | 4.3 |

TABLE 15B

| Reference mark | (pattern) | |
|---|---|---|
| | Heat Conductivity (cal/sec. cm. deg) | Peeling strength (kg/4 mm$^2$) |
| P21 | 0.620 | 4.0 |
| P22 | 0.601 | 4.2 |
| P23 | 0.586 | 4.5 |
| P24 | 0.510 | 4.8 |

TABLE 15B-continued

| | (pattern) | |
|---|---|---|
| Reference mark | Heat Conductivity (cal/sec. cm. deg) | Peeling strength (kg/4 mm²) |
| P25 | 0.408 | 5.0 |
| P26 | 0.609 | 4.9 |
| P27 | 0.600 | 4.6 |
| P28 | 0.595 | 4.2 |
| P29 | 0.582 | 4.3 |
| P30 | 0.442 | 4.1 |
| P31 | 0.560 | 4.4 |
| P32 | 0.529 | 4.4 |
| P33 | 0.428 | 4.2 |

TABLE 15C

| | (1st film) | |
|---|---|---|
| Reference mark | Heat Conductivity (cal/sec. cm. deg) | Peeling strength (kg/4 mm²) |
| C21 | 0.621 | 2.7 |
| C22 | 0.300 | 3.9 |
| C23 | 0.580 | 3.5 |
| C24 | 0.514 | 3.7 |
| C25 | 0.411 | 3.8 |
| C26 | 0.372 | 4.2 |
| C27 | 0.602 | 4.0 |
| C28 | 0.596 | 3.5 |
| C29 | 0.587 | 2.3 |
| C30 | 0.351 | 3.9 |
| C31 | 0.601 | 2.1 |
| C32 | 0.531 | 2.6 |
| C33 | 0.431 | 2.7 |

TABLE 15D

| | (pattern) | |
|---|---|---|
| Reference mark | Heat Conductivity (cal/sec. cm. deg) | Peeling strength (kg/4 mm²) |
| C21 | 0.600 | 1.3 |
| C22 | 0.300 | 3.8 |
| C23 | 0.551 | 2.7 |
| C24 | 0.499 | 2.7 |
| C25 | 0.387 | 2.9 |
| C26 | 0.361 | 3.8 |
| C27 | 0.571 | 3.1 |
| C28 | 0.582 | 2.4 |
| C29 | 0.431 | 1.1 |
| C30 | 0.348 | 3.8 |
| C31 | 0.526 | 0.9 |
| C32 | 0.497 | 0.9 |
| C33 | 0.380 | 1.0 |

The specimens in Tables 11A to 15D have the respective intermediate surface films 4 containing the zirconia and the alumina, however, some substances with small acidities are available, and a titanium oxide, an aluminum oxide, a magnesium oxide, a calcium oxide, a strontium oxide, an yttrium oxide and a barium oxide are the substances with small acidities by way of example. Moreover, it is possible that the upper surface film 5 is formed of a substance with a larger acidity than the substance used for formation of the intermediate surface film 4, and a boron oxide, a phosphorus oxide, a germanium oxide, an arsenic oxide, a selenium oxide, a tin oxide, an antimony oxide, a tellurium oxide and a sulfur oxide are available.

The insulating substrate of the third embodiment is also used for fabrication of a multi-level insulating substrate as similar to the first embodiment.

As will be understood from the foregoing description, the intermediate surface film 4 is effective against the penetration of the melted frits without increasing the total thickness of the intermediate and upper surface films. The insulating substrates according to the present invention are as large in heat conductivity as those without any lower and intermediate surface films, and are improved in the peeling strength. Although the insulating substrate according to the present invention is a little bit expensive rather than those disclosed in the U.S. Patent application filed on Feb. 5, 1990, the insulating substrate of the present invention is much advantageous in the peeling strength under repetition of firing stage without sacrifice of the heat conductivity.

Although particular embodiments of the present invention have been shown and described, it will be obvious to those skilled in the art that various changes and modifications may be made without departing from the spirit and scope of the present invention.

What is claimed is:

1. An insulating substrate for a conductive pattern made from a paste containing a glass frit having at least one basic component for regulating resistivity of said conductive pattern, comprising:
   a) a foundation containing aluminum nitride and incidental impurities; and
   b) a multi-level surface film structure provided between said foundation and said conductive pattern, in which said multi-level surface structure comprises a lower surface film provided on a surface of said foundation and containing aluminum oxide and incidental impurities said lower surface film having a thickness ranging from about 0.2 micron to about 15 micron, an intermediate surface film provided on said lower surface film and containing a substance having a relatively small acidity and incidental impurities said intermediate surface film having a thickness ranging from about 0.05 microns to about 1 micron, and an upper surface film provided on said intermediate surface film and containing a substance having a relatively large acidity and incidental impurities, said upper surface film having a thickness ranging from about 0.01 to about 1 micron.

2. An insulating substrate as set forth in claim 1, in which said foundation further contains at least one additive selected from the group consisting of yttrium trioxide represented by the molecular formula of $Y_2O_3$ and calcium oxide represented by the molecular formula of CaO, said at least one additive ranging from 0.1% to 10% by weight.

3. An insulating substrate as set forth in claim 1, in which said foundation contains additives represented by the molecular formula of $Y_2O_3$ and represented by the molecular formula of CaO, respectively.

4. An insulating substrate as set forth in claim 2, which the substance of said intermediate surface film is zirconium oxide.

5. An insulating substrate as set froth in claim 4, in which said substance of said intermediate surface film is represented by the molecular formula of $ZrO_2$.

6. An insulating substrate as set forth in claim 5, in which the thickness of said intermediate surface film ranges from about 0.05 micron to about 0.91 micron.

7. An insulating substrate as set forth in claim 2, in which said substrate of said intermediate surface film is a complex oxide of zirconium oxide and aluminum oxide.

8. An insulating substrate as set forth in claim 7, in which said zirconium oxide and said aluminum oxide are represented by molecular formulae of $ZrO_2$ and $Al_2O_3$, respectively.

9. An insulating substrate as set forth in claim 8, in which the content of said aluminum oxide is larger than about 0.5% by weight.

10. An insulating substrate as set forth in claim 9, in which the thickness of said intermediate surface film ranges from about 0.05 micron to about 0.98 micron.

11. An insulating substrate as set forth in claim 2, in which the substance of said upper surface film is silicon oxide.

12. An insulating substrate as set forth in claim 11, in which said substance of said upper surface film is represented by the molecular formula of $SiO_2$.

13. An insulating substrate as set forth in claim 2, in which said upper surface film further contains boron oxide having a relatively large acidity.

14. An insulating substrate s set forth in claim 13, in which said boron oxide is represented by the molecular formula of $B_2O_3$.

15. An insulating substrate as set forth in claim 14, in which the content of said boron oxide ranges from about 5% to about 50% by weight.

16. An insulating substrate for a conductive pattern made from a paste containing a glass frit having at least one basic component, said glass frit regulating resistivity of said conductive pattern, comprising:
   a) a foundation containing aluminum nitride, at least one additive selected from the group consisting of yttrium oxide and calcium oxide, and incidental impurities, said at least one additive ranging from about 0.1% to about 10% by weight;
   b) a lower surface film provided on a surface of said foundation and containing aluminum oxide and incidental impurities, the thickness of said lower surface film ranging from about $0.2\mu$ to about $7.9\mu$;
   c) an intermediate surface film provided on said lower surface film and containing zirconium oxide and incidental impurities, the thickness of said intermediate surface film ranging from about $0.05\mu$ to about $0.91\mu$ and
   d) an upper surface film provided on said intermediate surface film and containing silicon oxide and incidental impurities, the thickness of said upper surface film ranging from about $0.05\mu$ to about 0.8782 .

17. An insulating substrate for a conductive pattern made from a paste containing a glass frit having at least one basic component, said glass frit regulating resistivity of said conductive pattern, comprising:
   a) a foundation containing aluminum nitride, at least one additive selected from the group consisting of yttrium oxide and calcium oxide, and incidental impurities, said at least one additive ranging from about 0.1% to about 10% by weight;
   b) lower surface film provided on a surface of said foundation and containing aluminum oxide and incidental impurities, the thickness of said lower surface film ranging from about $1.5\mu$ to about $15\mu$;
   c) an intermediate surface film provided on said lower surface film and containing zirconium oxide, aluminum oxide and incidental impurities, the content of said aluminum oxide ranging from about 1% to about 30% by weight, the thickness of said intermediate surface film ranging from about $0.06\mu$ to about $0.86\mu$; and
   d) an upper surface film provided on said intermediate surface film and containing silicon oxide and incidental impurities, the thickness of said upper surface film ranging from about $0.07\mu$ to about $1\mu$.

18. An insulating substrate for a conductive pattern made from a paste containing glass frits each having a large basicity, said glass frits regulating resistivity of said conductive pattern, comprising:
   a) a foundation containing aluminum nitride, at least one additive selected from the group consisting of yttrium oxide and calcium oxide, and incidental impurities said at least one additive ranging from about 0.1% to about 10% by weight; and
   b) a lower surface film provided on a surface of said foundation and containing aluminum oxide and incidental impurities, the thickness of said lower surface film ranging from about $0.2\mu$ to about $15\mu$;
   c) an intermediate surface film provided on said lower surface film and containing zirconium oxide, aluminum oxide and incidental impurities, the content of said aluminum oxide ranging from about 0.5% to about 39.6% by weight, the thickness of said intermediate surface film ranging from about $0.05\mu$ to about $0.98\mu$; and
   d) an upper surface film provided on said intermediate surface film and containing boron oxide, silicon oxide and incidental impurities, the content of said boron oxide ranging from about 5.1% to about 49.6% by weight, the thickness of said upper surface film ranging from about $0.01\mu$ to about $1\mu$.

19. A multi-level surface film structure forming a part of an insulating substrate for a paste containing a glass frit and provided on a surface of a foundation, of aluminum nitrite comprising:
   a) a lower surface film provided on a surface of said foundation and containing aluminum oxide and incidental impurities said lower surface film having a thickness ranging from about 0.2 micron to about 15 micron;
   b) an intermediate surface film provided on said lower surface film and containing a substance having a relatively small acidity and incidental impurities said intermediate surface film having a thickness ranging from about 0.05 micron to about 1 micron; and
   c) an upper surface film provided on said intermediate surface film and containing a substance having a relatively large acidity and incidental impurities said upper surface film having a thickness ranging from about 0.01 micron to about 1 micron.

20. A thick film circuit comprising:
   a) an insulating substrate having:
      a-1) a foundation containing aluminum nitride and incidental impurities,
      a-2) a lower surface film provided on a surface of said foundation and containing aluminum oxide and incidental impurities said lower surface film having a thickness ranging from about 0.2 micron to about 15 micron,
      a-3) an intermediate surface film provided on said lower surface film and containing a substance having a relatively small acidity and incidental impurities said intermediate surface film having a thickness ranging from about 0.05 micron to about 1 micron, and
      a-4) an upper surface film provided on said intermediate surface film and containing a substance having a relatively large acidity and incidental impurities said upper surface film having a thickness ranging from about 0.01 micron to about 1 micron; and
   b) a conductive circuit pattern provided on said upper surface film and made from a paste containing a glass frit having at least one basic component, said glass frit regulating resistivity of said conductive circuit pattern; and
   c) a plurality of circuitry components.

* * * * *